(12) United States Patent
Shipley

(10) Patent No.: US 6,184,689 B1
(45) Date of Patent: Feb. 6, 2001

(54) SECONDARY SERVICE CONDUCTOR TESTER

(75) Inventor: Randy Shipley, Beaverton, OR (US)

(73) Assignee: H. J. Arnett Industries, Portland, OR (US)

(*) Notice: Under 35 U.S.C. 154(b), the term of this patent shall be extended for 0 days.

(21) Appl. No.: 09/234,756

(22) Filed: Jan. 21, 1999

(51) Int. Cl.[7] ............................. G01R 31/08; G01R 11/32
(52) U.S. Cl. .............................................. 324/527; 324/74
(58) Field of Search ........................ 324/527, 74; 338/82, 338/56

(56) References Cited

U.S. PATENT DOCUMENTS

| | | | |
|---|---|---|---|
| 4,646,003 | * | 2/1987 | Phillips et al. .......................... 324/74 |
| 5,650,717 | * | 7/1997 | Draus et al. ............................ 324/74 |

* cited by examiner

Primary Examiner—Safet Metjahic
Assistant Examiner—James Kerveros
(74) Attorney, Agent, or Firm—Chernoff, Vilhauer, McClung & Stenzel, LLP

(57) ABSTRACT

A secondary service conductor tester includes a housing. A set of at least two wires suitable for detachably engaging a meter base are electrically connected to the secondary electrical service of a power utility. A plurality of electrical loads each of which includes a fan unit are capable of drawing approximately 80 amps or more current when activated. A switch is electrically connected to at least one of the at least two wires and the plurality of electrical loads to select respective pairs of the three wires through which the current is drawn. A display indicates the electrical voltage drop when one of the respective pairs of wires are electrically connected to the meter base and the plurality of electrical loads are activated. The electrical loads and the switch enclosed within the housing and at least one of the at least two wires at least periodically electrically connected to the plurality of electrical loads in response to switching the switch.

17 Claims, 3 Drawing Sheets

SECONDARY SERVICE CONDUCTOR TESTER

BACKGROUND OF THE INVENTION

The present invention relates to a secondary service conductor tester.

An electrical power utility provides electrical power via either underground electrical cables or suspended electrical cables to its customers. A power revenue meter, which normally includes a rotating measurement dial, provides an interface connection between the electrically conductive cables of the power utility and the electrically conductive wiring of the customer. The power revenue meter provides an important delineation between the electrical cable which is the responsibility of the power utility to maintain and the electrical wiring of the customer which is the responsibility of the customer to maintain. The electrical cables from the power utility to the customer are referred to as secondary service, while the electrical wiring of the customer beyond the power revenue meter is referred to generally as the customer wiring.

Customers periodically complain to the power utility concerning potential electrical faults resulting from the secondary service. The customer is not permitted to remedy problems associated with the secondary service. For example, such secondary service electrical faults may include voltage fluctuations and electrical equipment malfunction which is normally the result of a faulty neutral wire. In response to a customer complaint regarding electrical faults, the power utility must verify the condition of the customer's secondary service. The secondary service includes the utilities electrical cables and mechanical connections between-separate electrical cables. To verify the operation of the secondary service a representative from the power utility must travel to the customer and remove the power revenue meter from its meter base supporting the revenue meter. For residential customers the power revenue meter is normally located on the side of the customer's residence at the point where the utility power cable (secondary) interfaces with the electrical wiring of the customer. The lineman then inspects the meter base for apparent visual problems such as loose contacts within the meter base. If no apparent problems exist, then a secondary service conductor tester is engaged with the meter base to replace the removed power revenue meter. The secondary conductor tester provides a current load to the secondary cables to simulate power usage by the customer in order to detect problems originating with the secondary service cables. In particular, the secondary conductor tester measures the voltage levels on the secondary cables, which if below some threshold value indicates that a fault may exist.

The secondary service electrical fault may be the result of many factors, such as, a poor connection of an electrical cable to the meter base, an insufficient crimp on a connector joining a pair of electrical cables, a poor connection of the electrical cable to a transformer on a utility pole, an electrical cable with poor electrical characteristics, or a short from the electrical cable to ground which normally occurs underground. The short from the electrical cable to ground may be the result of a gopher chewing away the insulation of the electrical cable.

If the utility determines that the source of the fault is in the customer wiring (e.g., not in the secondary service) then it is not the responsibility of the power utility to remedy the problem. Likewise, the customer is not permitted by the power utility to repair, remove the power revenue meter, nor generally check the secondary service. An electrical fault on the customer wiring may result from a multitude of factors, such as, an imbalanced load, a bad ground or neutral connection at an electrical panel, a faulty circuit breaker, or a poor appliance.

H. J. Arnett Industries, L.L.C. of Portland, Oreg. manufactures a secondary service conductor tester under the trade name The Super Beast. The Super Beast is a cylindrically shaped device with a set of rearwardly disposed electrical contacts that engage the contacts of the meter base in the same manner as the power revenue meter. The Super Beast is sized to be approximately the same as the displaced power revenue meter so that it may be supported by the meter base and fit within a housing that surrounds the meter base and power revenue meter. The Super Beast houses a pair of active loads which each draw 10 amps of current when activated. Each of the loads includes a primarily inductive/resistive element and a fan element. Each load is arranged within The Super Beast so that it is vented to the exterior of The Super Beast housing to provide self-cooling. The combination of the pair of self-cooling load elements and its compact size permits The Super Beast to be self supported on the meter base in the same manner as the power revenue meter.

When The Super Beast is engaged with the meter base, a fault condition on the secondary service is normally indicated by an 8–10 volt voltage drop on the secondary electrical cable when applying a 20-amp load to the secondary cable using both loads. Unfortunately, several minutes may be necessary before a significant voltage drop is detectable. This time delay before a noticeable voltage drop may be the result of a corroded mechanical connector joining a pair of electrical cables. In addition, frequently the voltage drop is somewhat greater than zero while being somewhat less than 8 volts making it difficult for the lineman to discern whether a fault exists within the secondary service. Accordingly, the lineman may have difficulty discerning some faults and may inadvertently terminate the secondary service test prior to the fault manifesting itself.

What is desired, therefore, is a secondary service conductor tester that makes it easier for a lineman to discern whether a fault exists on the secondary service.

SUMMARY OF THE INVENTION

The present invention overcomes the aforementioned drawbacks of the prior art by a secondary service conductor tester that includes a housing. A set of at least two wires suitable for detachably engaging a meter base are electrically connected to the secondary electrical service of a power utility. A plurality of electrical loads each of which includes a fan unit are capable of drawing approximately 80 amps or more current when activated. A switch is electrically connected to at least one of the at least two wires and the plurality of electrical loads to select respective pairs of the at least two wires through which the current is drawn. A display indicates the electrical voltage drop when a pair of wires are electrically connected to the meter base and the plurality of electrical loads are activated. The electrical loads and the switch enclosed within the housing and at least one of the at least two wires at least periodically electrically connected to the plurality of electrical loads in response to switching the switch.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
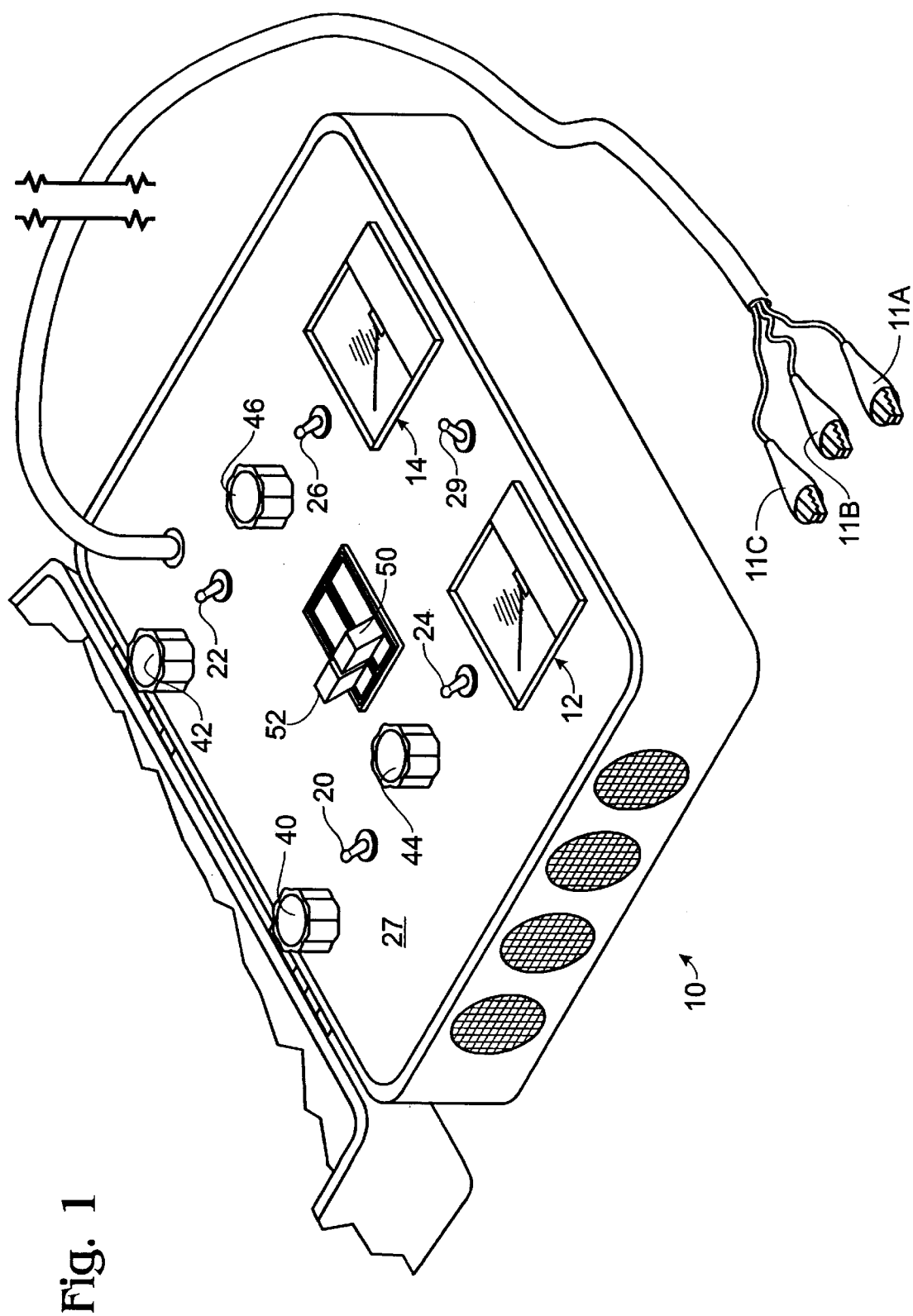
FIG. 1 is a pictorial view of an exemplary embodiment of a secondary service tester of the present invention with a portion of the lid broken away.

The present inventor came to the realization that the 20-amp maximum load current provided by The Super Beast is not sufficient to make fast accurate determinations of the condition of secondary service electrical cables. In fact, if the current load provided to the secondary line was dramatically increased to the range of approximately 80 amps or more, then testing of the secondary cables is both faster and more reliable. An 80-amp current load (at around 120 volts) switched onto the secondary service may periodically result in the wire at its connection with a lug to expand creating an improved electrical connection between the wire and aluminum lug. The expansion of the wire reduces the effects of any corrosion (CUA) buildup in the connection or a loose connection between the wire and the lug. The present-inventors have also determined that the resulting large current load and voltage may permit the identification of the source of the problem in the secondary service, namely the interconnection. This phenomena tends not to be readily noticeable at low current and voltage levels, such as 20-amps.

Alternatively, the 80-amp current load drawn through the wire and/or lug may result in "burning open" the connection. The resulting open connection creates a complete open circuit fault that may be located and repaired quickly by the lineman. Otherwise, it may be difficult to identify a poor connection at a particular lug from several potential lugs, especially when underground or a damaged portion of the wire. In either case, the use of a large current load, such as in the range of 80 amps or more, either indicates the existence of a poor interconnection of a pair of cables to a lug or results in an open circuit that is easily located and fixed. The use of a current load in the vicinity of 80-amps results in a significantly larger voltage drop that manifests itself relatively quickly which is easier to discern by the lineman. As a result, a lineman can more reliably discern whether a fault exists.

In order to provide a total load of 80-amps or more, The Super Beast would need to contain six additional 10-amp self-cooling load elements. The addition of six self-cooling load elements to The Super Beast would result in a significant increase in the size of the cylindrical housing. In addition, an 80-amp contact would be necessary which adds excessive weight and extreme bulk to the device. The overall resulting device would be too heavy to be self-supported by engagement with the meter base, thereby falling to the ground when not manually supported by the lineman. Moreover, the larger housing may not fit within a confined space proximate to an existing meter base (e.g., a meter base between two walls) making testing infeasible. If smaller non-self cooling loads are used then the resulting heat generated internally would likely damage the device.

In contrast to the present technique of using a secondary service conductor tester that mounts on the meter base in the same manner as the power revenue meter, the present inventors came to the realization that it is not necessary to support a test device by the meter base in the same manner as the power revenue meter, but rather the necessary load may be provided by a portable case that is connected to the meter base by detachably engageable cables. The portable case provides both a housing for a sufficient number of self-cooling load elements while being sufficiently light-weight and portable for linemen.

Referring to FIG. 1, a portable secondary service conductor tester 10 includes a set of three wires 11A, 11B, and 11C. The neutral wire 11B is connected to the neutral connection at the meter socket (not shown). Right wire 11A and left wire 11C are connected to respective right and left "hot" lines of the meter housing. A pair of meters 12 and 14 and a set of four switches 20, 22, 24, and 26 are housed on the front panel 27 of the tester 10. A center locked switch 29 switches all of the loads between the right wire 11A and the left wire 11C. A center locked switch 29 permits the switch to be switched from the center position to either the left or the right. However, a center locked switch does not permit the switch to be switched from the left to the right, or the right to the left, without stopping in the center position. This avoids a user switching between the left and right "on" positions too quickly and resulting in damage to the device. Each of the switches 20, 22, 24, and 26, selectively enables pairs of separate load devices 30, 32, 34, and 36 within the device to be loaded onto the wire selected by the switch 29 of the secondary service. A set of fuses 40, 42, 44, and 46 provide overcurrent protection to the respective loads.

Each of the loads 30, 32, 34, 36 is preferably a high current self-cooling element that includes an integral fan unit for cooling purposes. Such a self-cooling element may be the heater and fan elements from a household hair dryer, such as a 1600 watt hair dryer which draws 10 amps. This provides both a high current load element and cooling capabilities by movement of air there through. To provide the necessary load current substantially greater than the 20 amp current load provided by previous secondary service testers, each of the four load elements includes a pair of 10 amp load elements for a total of approximately 80 amps. Each switch controls a separate load 30, 32, 34, and 36 so that loads of 20 amps, 40 amps, 60 amps, and 80 amps may be provided to either wire 11A and 11C, as needed for the particular test. Being capable of providing substantially more than 20 amps, such as 80 amps, permits the device to quickly test the secondary service, and either open or identify poor connections at lugs making service quicker. A pair of 100 amp 2-pole breakers 50 and 52 protect the wires 11A and 11C.

Figure 3:
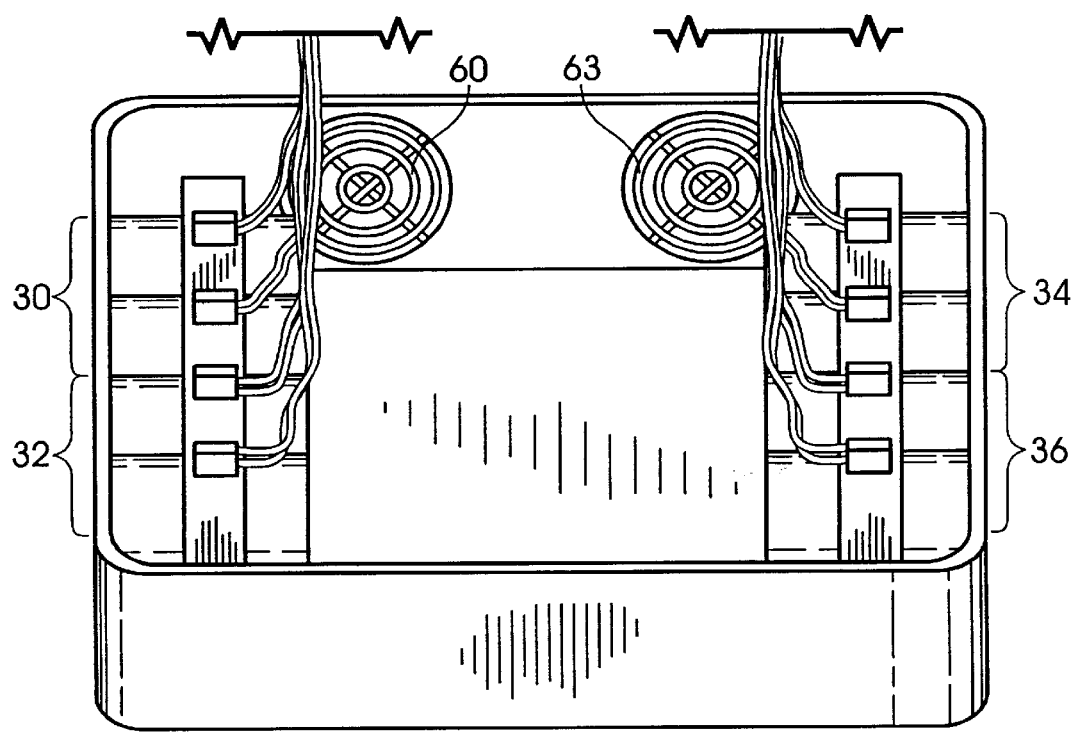
FIG. 3 is a pictorial view of the interior of the secondary service tester of FIG. 1.

Referring to FIG. 3, the load elements are aligned with four on each side of the tester 10 with the fan units directed so that the air blows outwardly. A pair of intake vents 60 and 63 on the side of the device 10 permit sufficient air flow into the device. The open structure combined with the fan cooled load elements provides a self-cooling device that does not overheat.

Figure 4:
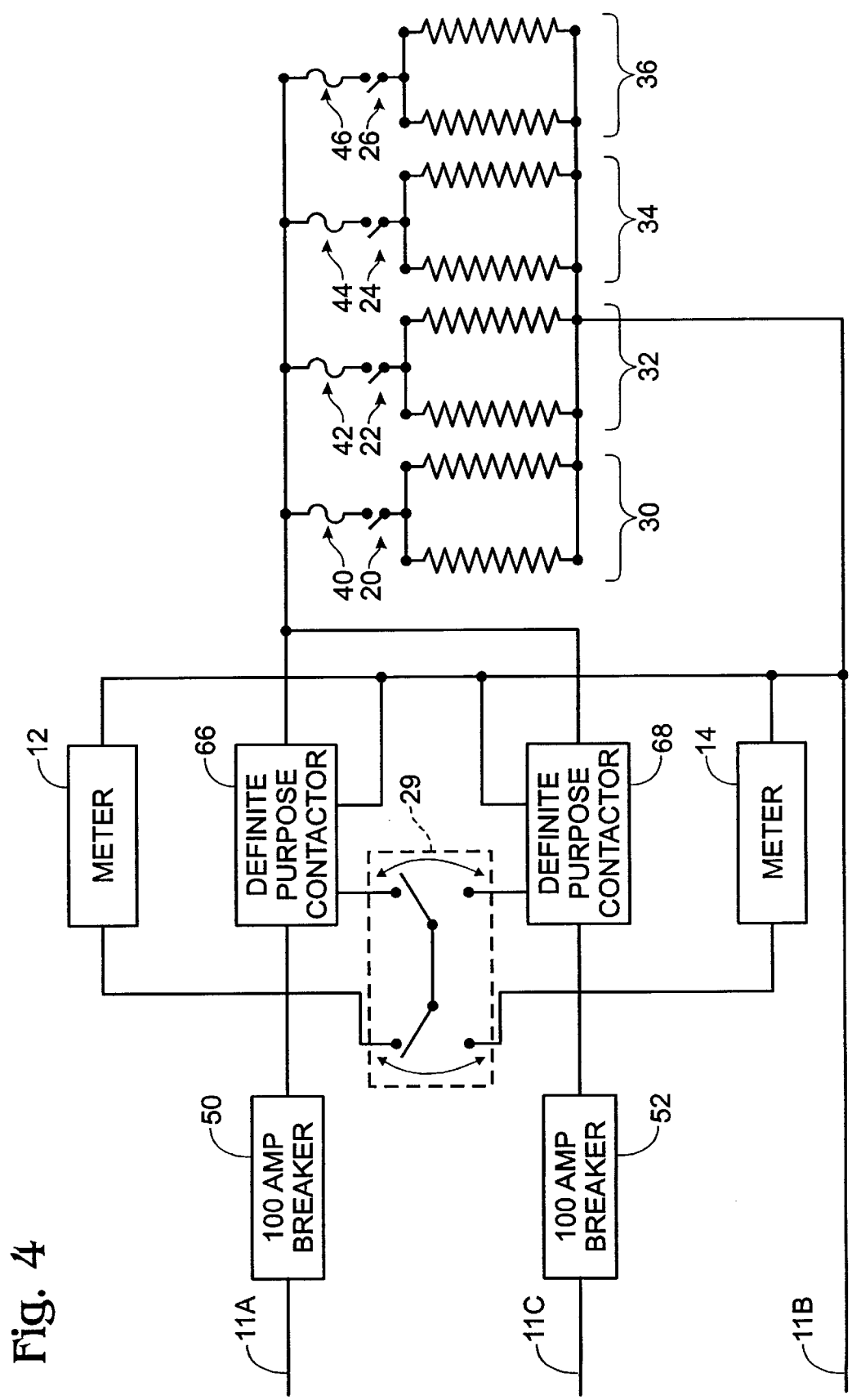
FIG. 4 is a circuit diagram of the secondary service tester of FIG. 1.

Referring to FIG. 4, wires 11A and 11C are connected to respective ones of the 100 amp circuit breakers 50 and 52. The output of each circuit breaker is connected to a respective definite purpose contactor 66 and 68. Respective meters 12 and 14 are connected between the neutral wire 11B and the respective wires 11A and 11C to measure the voltage between the wires 11A, 11C and neutral 11B. The output of each contactor 66, 68 is connected to the loads 30, 32, 34, 36 through the fuses 40, 42, 44, 46 and respective switches 20, 22, 24, 26. Without a load thereon the meter will read full voltage levels, such as 120 volts. The switch 29 selects wire 11A or 11C and the contactor forms a conductive path between the respective circuit breaker 50, 52 and the load 30, 32, 34, 36. The total load is selected by the switches 20, 22, 24 and 26.

Figure 2:
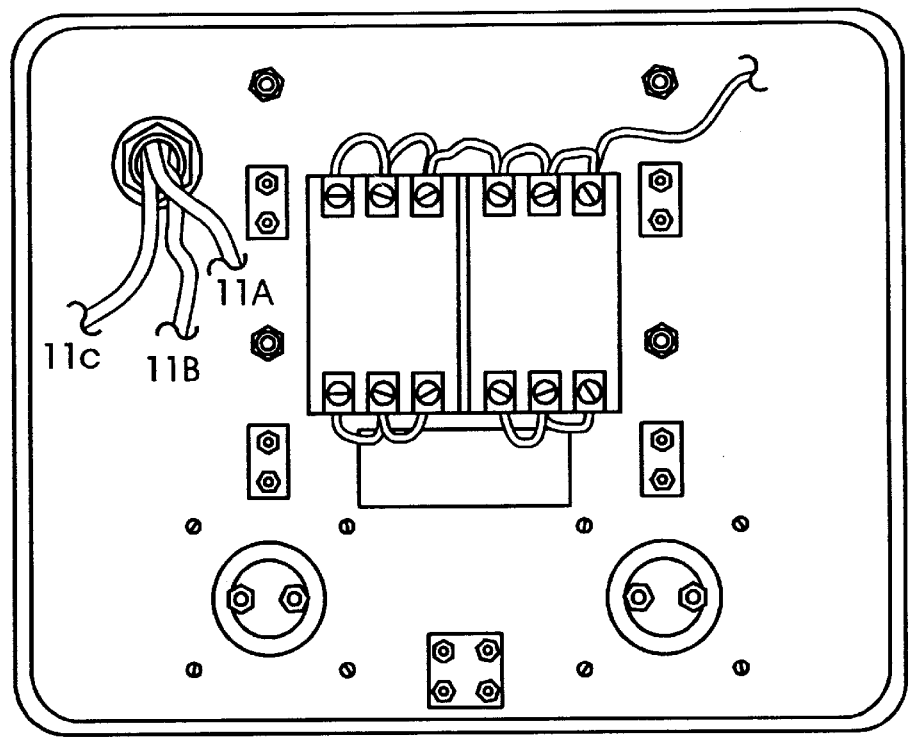
FIG. 2 is a pictorial view of the back panel of the secondary service tester of FIG. 1.

A definite purpose contactor capable of switching 80 amps or more for the load is an extremely heavy, bulky, and expensive device. Such a contactor would not fit within a briefcase sized housing and a lineman would have difficulty repeatedly lifting it. Referring to FIG. 2, the present inventor came to the realization that a lighter, compact, relatively inexpensive 3-pole contactor 66, 68 designed for 3-phase circuits may be used in a single phase application if each of the poles are connected in parallel with one another. The preferred contactor is a 40-amp 3 pole contactor thereby providing a total 120-amp capability, available from Siemens Industrial Control Products, Catalog Number 42CF35A.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of testing the secondary service to a customer comprising the steps of:
   (a) providing a housing with a set of at least two wires extending therefrom for detachably engaging a meter base electrically connected to the secondary electrical service of a power utility;
   (b) providing a plurality of electrical loads enclosed within said housing each of which includes a fan unit;
   (c) selectively activating said plurality of electrical loads together capable of drawing substantially 80 amps or more current through at least one of said at least two wires at least periodically electrically connected to said plurality of electrical loads; and
   (d) displaying on a display an indication of the electrical voltage drop when at least one of said at least two wires is electrically connected to said meter base and at least one of said plurality of electrical loads is activated.

2. The method of claim 1, further comprising the step of activating a first definite purpose contactor interconnecting at least one of said at least two wires with said plurality of electrical loads wherein said first definite purpose contactor includes at least two separate contacts connected in parallel.

3. The tester of claim 2 wherein said first definite purpose contactor includes three separate contacts connected in parallel.

4. The tester of claim 3, further comprising the step of activating a second definite purpose contactor interconnecting another one of said at least two wires with said plurality of electrical loads wherein said second definite purpose contactor includes at least two separate contacts connected in parallel.

5. The tester of claim 4, further comprising the step of interconnecting a first circuit breaker with said at least one of said at least two wires with said first definite purpose contactor, and interconnecting a second circuit breaker with said another one of said at least two wires with said second definite purpose contactor.

6. The tester of claim 5, further comprising:
   (a) selectively electrically connecting at least one of said at least two wires to a first portion of said plurality of electrical loads;
   (b) selectively electrically connecting said at least one of said at least two wires to a second portion of said plurality of electrical loads;
   (c) selectively electrically connecting said at least one of said at least two wires to a third portion of said plurality of electrical loads;
   (d) selectively electrically connecting said at least one of said at least two wires to a fourth portion of said plurality of electrical loads; and
   (e) wherein said first portion, said second portion, said third portion, and said fourth portion are independent from one another.

7. The tester of claim 6 wherein said first portion, said second portion, said third portion, and said fourth portion each draw substantially 20 amps of current.

8. The tester of claim 7 wherein each of said first portion, said second portion, said third portion, and said fourth portion each include a pair of self-cooling load elements of substantially 10 amps of current.

9. The tester of claim 1 wherein said electrical loads together draw substantially 80 amps.

10. A secondary service conductor tester comprising:
    (a) a housing;
    (b) a set of three wires suitable for detachably engaging a meter base electrically connected to the secondary electrical service of a power utility;
    (c) a plurality of electrical loads each of which includes a fan unit, said plurality of electrical loads together capable of drawing substantially 80 amps or more current when activated;
    (d) a switch electrically connected to at least one of said three wires and said plurality of electrical loads to select respective pairs of said three wires through which said current is drawn;
    (e) a display indicating the electrical voltage drop when one of said respective pairs of wires are electrically connected to said meter base and said plurality of electrical loads are activated; and
    (f) said electrical loads and said switch enclosed within said housing and at least one of said three wires at least periodically electrically connected to said plurality of electrical loads in response to switching said switch.

11. The tester of claim 10, further comprising a first definite purpose contactor interconnecting at least one of said three wires with said plurality of electrical loads wherein said first definite purpose contactor includes at least two separate contacts connected in parallel.

12. The tester of claim 11 wherein said first definite purpose contactor includes three separate contacts connected in parallel.

13. The tester of claim 12, further comprising a second definite purpose contactor interconnecting another one of said three wires with said plurality of electrical loads wherein said second definite purpose contactor includes at least two separate contacts connected in parallel.

14. The tester of claim 13, further comprising a first circuit breaker interconnecting said at least one of said three wires with said first definite purpose contactor, and a second circuit breaker interconnecting said another one of said three wires with said second definite purpose contactor.

15. The tester of claim 14, further comprising:
(a) a first switch selectively electrically connecting at least one of said three wires to a first portion of said plurality of electrical loads;
(b) a second switch selectively electrically connecting said at least one of said three wires to a second portion of said plurality of electrical loads;
(c) a third switch selectively electrically connecting said at least one of said three wires to a third portion of said plurality of electrical loads;
(d) a fourth switch selectively electrically connecting said at least one of said three wires to a fourth portion of said plurality of electrical loads; and
(e) said first portion, said second portion, said third portion, and said fourth portion independent from one another.

16. The tester of claim 15 wherein said first portion, said second portion, said third portion, and said fourth portion each draw substantially 20 amps of current.

17. The tester of claim 16 wherein each of said first portion, said second portion, said third portion, and said fourth portion each include a pair of self-cooling load elements of substantially 10 amps of current.

* * * * *